(12) United States Patent
Kennedy et al.

(10) Patent No.: US 6,408,786 B1
(45) Date of Patent: Jun. 25, 2002

(54) SEMICONDUCTOR PROCESSING EQUIPMENT HAVING TILED CERAMIC LINER

(75) Inventors: William S. Kennedy, Redwood Shores; Robert A. Maraschin, Cupertino; Jerome S. Hubacek, Fremont, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/401,193

(22) Filed: Sep. 23, 1999

(51) Int. Cl.$^7$ ............................................. C23C 16/507
(52) U.S. Cl. ................. 118/723 AN; 118/724; 156/345.1
(58) Field of Search ............... 156/345; 118/723 R, 118/723 AN; 376/136

(56) References Cited

U.S. PATENT DOCUMENTS

| | | | |
|---|---|---|---|
| 4,340,462 A | 7/1982 | Koch | 204/298 |
| 4,491,496 A | 1/1985 | Laporte et al. | 156/345 |
| 4,690,793 A * | 9/1987 | Hitachi et al. | 376/136 |
| 4,948,458 A | 8/1990 | Ogle | 156/643 |
| 5,006,220 A | 4/1991 | Hijikata et al. | 204/298.33 |
| 5,022,979 A | 6/1991 | Hijikata et al. | 204/298.33 |
| 5,085,727 A | 2/1992 | Steger | 156/345 |
| 5,182,059 A | 1/1993 | Kawasaki et al. | 264/65 |
| 5,200,232 A | 4/1993 | Tappan et al. | 427/569 |
| 5,262,029 A | 11/1993 | Erskine et al. | 204/298.15 |
| 5,292,399 A | 3/1994 | Lee et al. | 156/643 |
| 5,366,585 A | 11/1994 | Robertson et al. | 156/643 |
| 5,556,501 A | 9/1996 | Collins et al. | 156/345 |
| 5,569,356 A | 10/1996 | Lenz et al. | 156/643.1 |
| 5,641,375 A | 6/1997 | Nitescu et al. | 156/345 |
| 5,680,013 A | 10/1997 | Dornfest et al. | 315/111.21 |
| 5,788,799 A * | 8/1998 | Steger et al. | 156/345 |
| 5,798,016 A | 8/1998 | Oehrlein et al. | 156/345 |
| 5,820,723 A | 10/1998 | Benjamin et al. | 156/345 |
| 5,838,529 A | 11/1998 | Shufflebotham et al. | 361/234 |
| 5,863,376 A | 1/1999 | Wicker et al. | 156/345 |
| 5,885,356 A * | 3/1999 | Zhao et al. | 118/723 R |
| 5,888,907 A | 3/1999 | Tomoyasu et al. | 438/714 |
| 5,895,586 A | 4/1999 | Kaji et al. | 219/121.43 |
| 5,904,778 A | 5/1999 | Lu et al. | 118/723 R |

FOREIGN PATENT DOCUMENTS

| | | | | |
|---|---|---|---|---|
| EP | 0 732 729 A | | 9/1996 | |
| EP | 0 838 842 A | | 4/1998 | |
| JP | 61104291 A | * | 10/1984 | ............ G21B/1/00 |
| WO | 98/14980 A | | 4/1998 | |

OTHER PUBLICATIONS

Howard Mizuhara et al, "Ceramic/Metal Seals", Engineered Materials Handbook pp. 502–510, Nov. 1995.*
William F. Harrington, "Elastomeric Adhesives", Engineering Materials Handbook, vol. 3, pp. 143–150, Dec. 1990.*

* cited by examiner

Primary Examiner—Gregory Mills
Assistant Examiner—Rudy Zervigon
(74) Attorney, Agent, or Firm—Burns, Doane, Swecker & Mathis, LLP

(57) ABSTRACT

A plasma processing chamber including a ceramic liner in the form of ceramic tiles mounted on a resilient support member. The liner and other parts such as a gas distribution plate and a plasma screen can be made of SiC which advantageously confines the plasma and provides temperature control of the inner surfaces of the chamber. The liner can be heated by a heater which provides heat to the liner by thermal conduction. To remove excess heat from the liner, the resilient support can be an aluminum support frame which conducts heat from the liner to a temperature controlled member such as a top plate of the chamber. The support frame can include a continuous upper portion and a segmented lower portion which allows thermal stresses to be accommodated during processing of semiconductor substrates in the plasma chamber.

20 Claims, 6 Drawing Sheets

SEMICONDUCTOR PROCESSING EQUIPMENT HAVING TILED CERAMIC LINER

FIELD OF THE INVENTION

The invention relates to semiconductor processing equipment and more particularly to a ceramic liner for a processing chamber such as a plasma etching chamber.

BACKGROUND OF THE INVENTION

In the field of semiconductor processing, vacuum processing chambers are generally used for etching and chemical vapor deposition (CVD) of materials on substrates by supplying an etching or deposition gas to the vacuum chamber and application of an RF field to the gas to energize the gas into a plasma state. Examples of parallel plate, transformer coupled plasma (TCP™) which is also called inductively coupled plasma (ICP), and electron-cyclotron resonance (ECR) reactors and components thereof are disclosed in commonly owned U.S. Pat. Nos. 4,340,462; 4,948,458; 5,200,232 and 5,820,723. Because of the corrosive nature of the plasma environment in such reactors and the requirement for minimizing particle and/or heavy metal contamination, it is highly desirable for the components of such equipment to exhibit high corrosion resistance.

During processing of semiconductor substrates, the substrates are typically held in place within the vacuum chamber on substrate holders by mechanical clamps and electrostatic clamps (ESC). Examples of such clamping systems and components thereof can be found in commonly owned U.S. Pat. Nos. 5,262,029 and 5,838,529. Process gas can be supplied to the chamber in various ways such as by gas nozzles, gas rings, gas distribution plates, etc. An example of a temperature controlled gas distribution plate for an inductively coupled plasma reactor and components thereof can be found in commonly owned U.S. Pat. No. 5,863,376.

Aluminum and aluminum alloys are commonly used for walls of plasma reactors. In order to prevent corrosion of the walls, various techniques have been proposed for coating the aluminum surface with various coatings. For instance, U.S. Pat. No. 5,641,375 discloses that aluminum chamber walls have been anodized to reduce plasma erosion and wear of the walls. The '375 patent states that eventually the anodized layer is sputtered or etched off and the chamber must be replaced. U.S. Pat. No. 5,680,013 states that a technique for flame spraying $Al_2O_3$ on metal surfaces of an etching chamber is disclosed in U.S. Pat. No. 4,491,496. The '013 patent states that the differences in thermal expansion coefficients between aluminum and ceramic coatings such as aluminum oxide leads to cracking of the coatings due to thermal cycling and eventual failure of the coatings in corrosive environments. U.S. Pat. No. 5,085,727 discloses a carbon coating for walls of a plasma chamber wherein the coating is deposited by plasma assisted CVD.

In order to protect the chamber walls, U.S. Pat. Nos. 5,366,585; 5,556,501; 5,788,799; 5,798,016; and 5,885,356 propose liner arrangements. For instance, the '585 patent discloses a free standing ceramic liner having a thickness of at least 0.005 inches and machined from solid alumina. The '585 patent also mentions use of ceramic layers which are deposited without consuming the underlying aluminum can be provided by flame sprayed or plasma sprayed aluminum oxide. The '501 patent discloses a process-compatible liner of polymer or quartz or ceramic. The '799 patent discloses a temperature controlled ceramic liner having a resistance heater embedded therein and the ceramic can be alumina, silica, titania, zirconia, silicon carbide, titanium carbide, zirconium carbide, aluminum nitride, boron nitride, silicon nitride and titanium nitride. The '016 patent discloses a liner of ceramics, aluminum, steel and/or quartz with aluminum being preferred for its ease of machinability and having a coating of aluminum oxide, $Sc_2O_3$ or $Y_2O_3$, with $Al_2O_3$ being preferred for coating aluminum to provide protection of the aluminum from plasma. The '356 patent discloses a ceramic liner of alumina and a ceramic shield of aluminum nitride for the wafer pedestal for use in CVD chambers. U.S. Pat. No. 5,904,778 discloses a SiC CVD coating on free standing SiC for use as a chamber wall, chamber roof, or collar around the wafer. U.S. Pat. No. 5,292,399 discloses a SiC ring surrounding a wafer pedestal. A technique for preparing sintered SiC is disclosed in U.S. Pat. No. 5,182,059.

With regard to plasma reactor components such as showerhead gas distribution systems, various proposals have been made with respect to the materials of the showerheads. For instance, commonly owned U.S. Pat. No. 5,569,356 discloses a showerhead of silicon, graphite, or silicon carbide. U.S. Pat. No. 5,888,907 discloses a showerhead electrode of amorphous carbon, SiC or Al. U.S. Pat. Nos. 5,006,220 and 5,022,979 disclose a showerhead electrode either made entirely of SiC or a base of carbon coated with SiC deposited by CVD to provide a surface layer of highly pure SiC.

In view of the need for high purity and corrosion resistance for components of semiconductor processing equipment, there is a need in the art for improvements in materials and/or coatings used for such components. Moreover, with regard to the chamber materials, any materials which can increase the service life of a plasma reactor chamber and thus reduce the down time of the apparatus, would be beneficial in reducing the cost of processing the semiconductor wafers.

SUMMARY OF THE INVENTION

The invention provides a tiled liner for a plasma processing chamber wherein semiconductor substrates can be processed. The tiled liner comprises an assembly of ceramic tiles located inwardly of a sidewall of the chamber. The plasma chamber can include a substrate support, a gas supply and an energy source. The substrate support on which one or more substrates can be processed is located within the interior space of the chamber. The chamber sidewall is spaced outwardly of a periphery of the substrate support and the gas supply supplies process gas to the interior space. The energy source energizes the process gas in the interior space into a plasma state during processing of the substrate.

According to a preferred embodiment, the tiled liner is supported by a resilient support member such as an elastomeric joint or an elastically bendable metal frame. For instance, the resilient support can comprise an elastomeric joint which attaches each of the ceramic tiles to a respective metal backing member. The metal backing members can be supported on an elastically bendable metal frame supported by a thermally controlled member such that heat can be withdrawn from the ceramic tiles via a thermal path which extends through the elastomeric joint, the metal backing members and the bendable metal frame to the thermally controlled member. Alternatively, the resilient support can comprise an elastomeric joint between each of the ceramic tiles and the chamber sidewall.

The tiles can be a series of interlocked ceramic tiles such as SiC tiles. The elastically bendable metal frame can include an inner frame member and an outer frame member, the inner frame member being supported by the outer frame member and the outer frame member being supported by the chamber. The inner and outer metal frame members can be configured to allow differential thermal stresses on the tiled liner and the frame members to be accommodated during operation of the plasma processing system. In such an arrangement, an upper portion of the outer frame member can be supported by a thermally controlled part of the chamber, a lower portion of the outer frame member can be attached to a lower portion of the inner frame member, and the tiled liner can be supported by the inner frame member. Further, the bendable metal frame can include a continuous upper portion and a segmented lower portion. For instance, the bendable metal frame can be cylindrical and the segmented lower portion can comprise axially extending segments separated from each other by axially extending slots. If the inner and outer metal frame members are cylindrical and include continuous upper portions and segmented lower portions, the segmented lower portions comprise axially extending segments separated from each other by axially extending slots.

According to another embodiment of the invention, a ceramic plasma screen extends inwardly from a lower portion of the tiled liner, the ceramic plasma screen including passages through which process gas and reaction byproducts are removed from the interior of the chamber during processing of a substrate. For instance, the ceramic plasma screen can comprise a plurality of discrete screen segments supported in an annular space between the chamber sidewall and the substrate support, the passages comprising slots extending radially inwardly from the chamber sidewall. The ceramic plasma screen can be attached to the bendable metal frame by an electrically conductive elastomeric joint and the plasma screen can be electrically grounded to the bendable metal frame by the elastomeric joint.

DETAILED DESCRIPTION OF THE PREFERRED EMBODIMENTS

According to the invention, a tiled liner comprising an assembly of ceramic tiles can achieve one or more of the following objectives: maintaining good plasma formation by providing an electrical path to ground through the liner, avoiding process drift by providing thermal control of the liner, overcoming differential thermal expansion between ceramic and metal components by providing a resilient liner support, and preventing aluminum ("Al") contamination by shielding Al chamber walls and components from the substrate being processed. With regard to the electrical grounding of the liner, the ceramic liner is made from an electrically conductive material. A preferred ceramic material is Si or SiC, materials which can be obtained in high purity and which have been found to exhibit high resistance to the corrosive conditions found in plasma reactors such as plasma etching chambers.

The invention provides a plasma chamber wherein various components including a ceramic liner are made of Si or SiC. Such materials are compatible in plasma environments since plasma erosion of Si or SiC produces gaseous Si or C compounds which can be pumped from the chamber without particle contamination of the substrate. With regard to thermal control, SiC has been found to exhibit exceptionally high thermal conductivity enabling the liner to be heated or cooled to a desired temperature range during processing of substrates such as silicon wafers. With regard to overcoming differential expansion, the resilient support according to the invention is designed to allow the ceramic liner to freely expand or contract within the chamber. With regard to preventing Al contamination, the ceramic liner confines the plasma inwardly of the liner and thus avoids attack of Al walls or components by the plasma.

Figure 1:
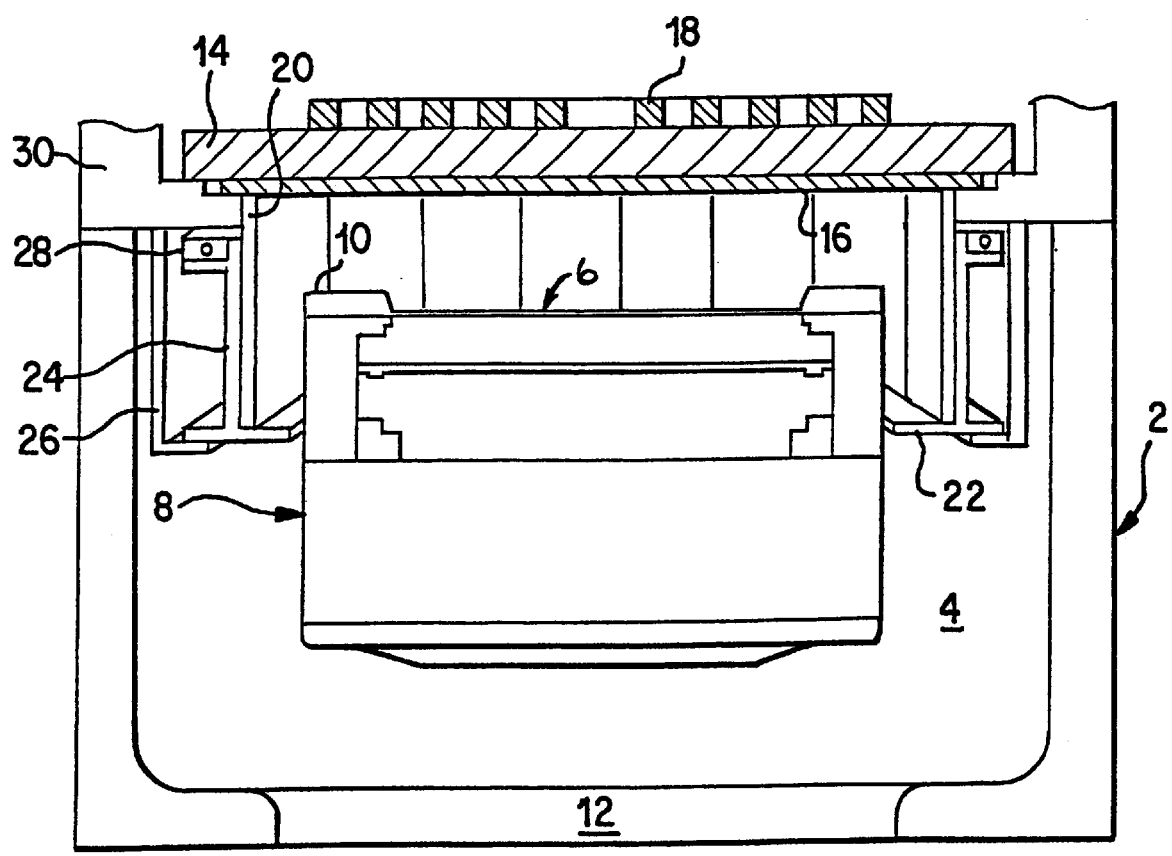
FIG. 1 shows a plasma reaction chamber in accordance with a first embodiment of the invention wherein a tiled liner supported on a resilient frame surrounds a substrate support.

A vacuum processing chamber according to the present invention may be used for various semiconductor plasma processing steps such as etching, deposition, resist stripping, etc. An example of a single wafer vacuum processing chamber 2 having an inductively coupled plasma source is shown in FIG. 1 wherein processing gas is supplied to the processing chamber 2 by suitable apparatus (not shown) such as gas distribution rings, gas distribution plate, injection nozzles, etc., and a vacuum is maintained in the interior 4 of the chamber by suitable vacuum pump apparatus. The substrate to be processed in the chamber can comprise a silicon semiconductor wafer 6 supported on a substrate support 8. The substrate support 8 can include an electrostatic chuck and a focus ring 10. The vacuum pump can be connected to a large outlet port 12 in an endwall such as the bottom of process chamber. The vacuum processing chamber can include a dielectric window 14, a gas distribution plate 16 and RF power can be supplied to the chamber through an external RF antenna such as a planar coil 18 outside the dielectric window 14 on an endwall such as the top of the chamber. However, the plasma generating source can be of any other type of plasma generating equipment such as that of an ECR reactor, parallel plate reactor, helicon reactor, helical resonator, etc. The plasma generating source can be attached to a modular mounting arrangement such as an annular mounting flange which is removably mounted on the endwall of the chamber.

In order to maintain a vacuum tight seal between the mounting flange and the chamber 2, suitable O-ring seals can be fitted within grooves in the endwall of the chamber 2 and RF shielding members can surround the vacuum seals. If a large vacuum force is provided by the vacuum pump, it is not necessary to utilize fasteners for attaching the mounting flange to the chamber 2. Instead, the mounting flange can simply rest on the endwall of the chamber 2. If desired, the mounting flange or another part of the plasma generating source assembly can be hinged to the chamber 2 such that the plasma generating source can be pivoted to an orientation such as a vertical orientation for servicing the interior 4 of the chamber 2.

The chamber includes a liner 20 comprised of ceramic tiles. A plasma screen 22 for confining the plasma in the space surrounding the wafer 6 extends inwardly from the lower end of the liner 20. In the embodiment shown in FIG. 1, the liner 20 is supported by an elastically bendable frame which includes an inner support frame 24 and an outer support frame 26. In order to maintain the liner at a desired temperature during processing of a substrate, a heater 28 is provided on the top of the inner frame support 24. In operation, the heater 28 is effective to heat the liner 20 and removal of heat from the liner 20 can be accomplished by a temperature controlled member 30 which withdraws heat from the liner through the inner and outer frames. Other types of:heating arrangements such as a heater embedded in the liner or suitable radiant heating arrangements can also be used. Details of a suitable radiant heater are disclosed in commonly owned U.S. Ser. No. 09/401,308 filed Sep. 23, 1999, the disclosure of which is hereby incorporated by reference.

Figure 2:
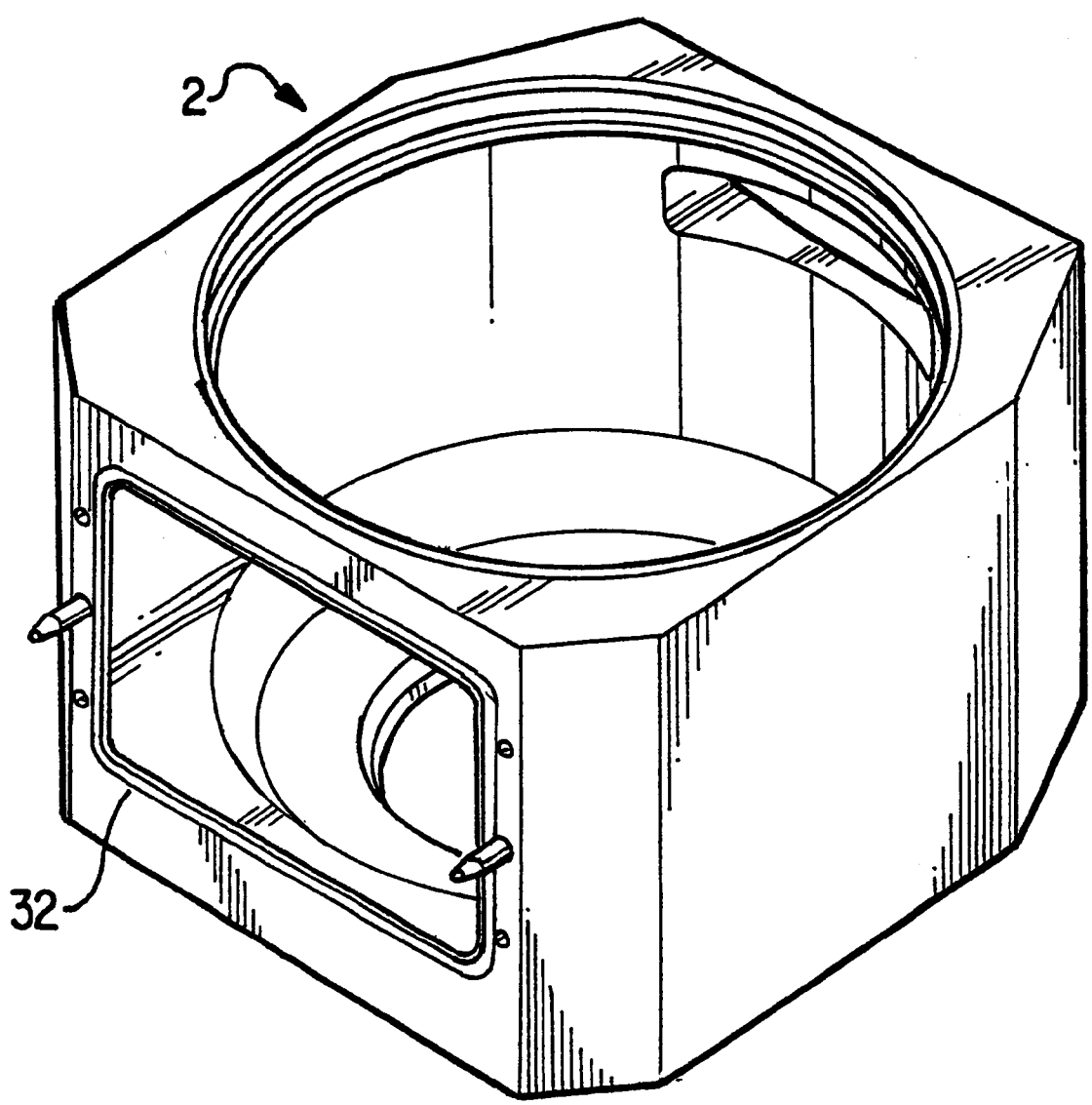
FIG. 2 shows the plasma reaction chamber of FIG. 1 without various components including the liner.

As shown in FIG. 2, the chamber can have a modular design which allows various plasma generating sources to be mounted thereon. Further, the substrate support 8 can be supported at one end of a support arm mounted in a cantilever fashion such that the entire substrate support/support arm assembly can be removed from the chamber by passing the assembly through an opening 32 in the sidewall of the chamber. The chamber can be of any suitable material and according to a preferred embodiment of the invention the chamber is formed out of a single piece of aluminum or an aluminum alloy.

Figure 3:
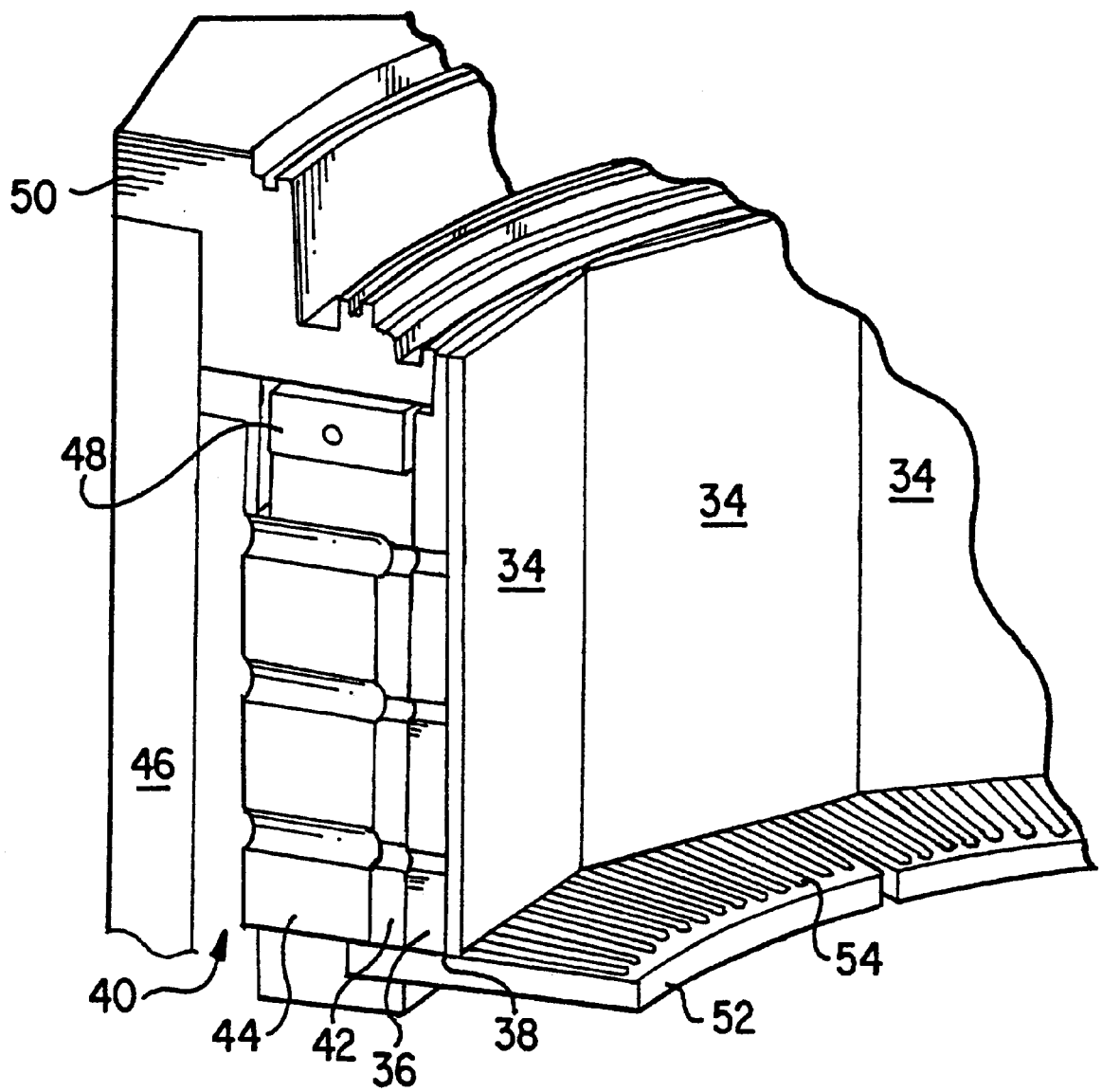
FIG. 3 shows an embodiment of the invention wherein the ceramic liner comprises a series of tiles mounted on backing plates.
Figure 4:
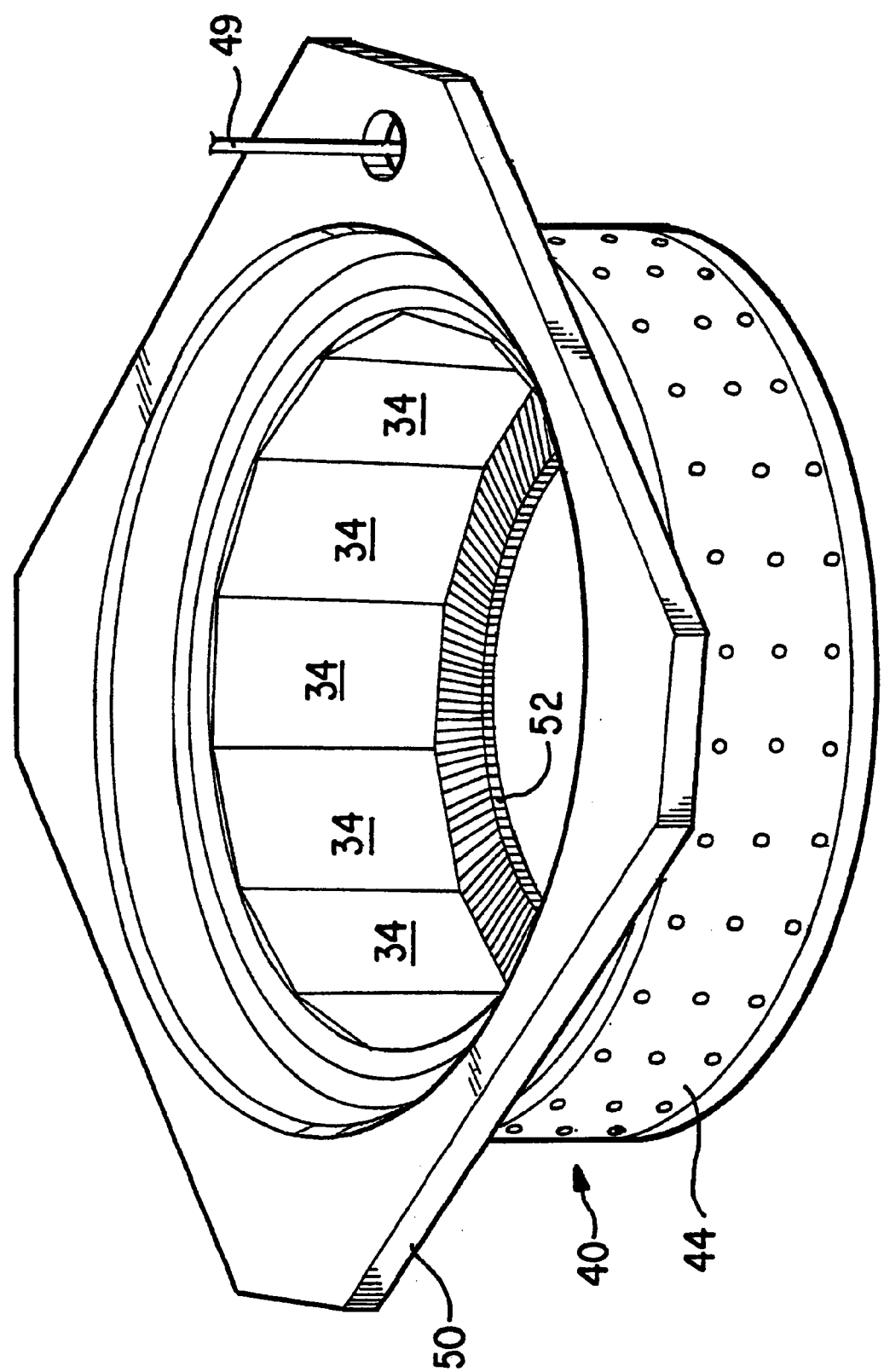
FIG. 4 shows a perspective view of the plasma reaction chamber of FIG. 3.

According to a first embodiment of the invention, the plasma chamber liner 20 comprises interlocking ceramic liner elements such as flat tiles 34, as shown in FIGS. 3 and 4. To provide an electrical ground path for the plasma, the tiles 34 are preferably of an electrically conductive material such as silicon or silicon carbide. Such a material provides an added benefit in that it does not contain aluminum and thus reduces Al contamination of processed substrates. According to a preferred embodiment, SiC tiles are bonded to an aluminum backing plate 36. A preferred bonding material is an electrically conductive elastomer 38 which can absorb lateral stresses caused by different thermal expansion coefficients of the SiC and Al. Each tile and backing plate assembly can be attached to the chamber wall by an elastically bendable frame 40 which includes an inner frame 42 and an outer frame 44. Temperature control of the liner is achieved by a heater 48 supplied power by electrical leads 49 and a temperature controlled member 50.

The elastomeric joint can comprise any suitable elastomeric material such as a polymer material compatible with a vacuum environment and resistant to thermal degradation at high temperatures such as above 200° C. The elastomer material can optionally include a filler of electrically and/or thermally conductive particles or other shaped filler such as wire mesh, woven or non-woven conductive fabric, etc. Polymeric materials which can be used in plasma environments above 160° C. include polyimide, polyketone, polyetherketone, polyether sulfone, polyethylene terephthalate, fluoroethylene propylene copolymers, cellulose, triacetates, silicone, and rubber. Examples of high purity elastomeric materials include one-component room temperature curing adhesives available from General Electric as RTV 133 and RTV 167, a one-component flowable heat-curable (e.g. over 100° C.) adhesive available from General Electric as TSE 3221, and a two-part addition cure elastomer available from Dow Corning as "SILASTIC." An especially preferred elastomer is a polydimethylsiloxane containing elastomer such as a catalyst cured, e.g. Pt-cured, elastomer available from Rhodia as V217, an elastomer stable at temperatures of 250° C. and higher.

In the case where the elastomer is an electrically conductive elastomer, the electrically conductive filler material can comprise particles of a an electrically conductive metal or metal alloy. A preferred metal for use in the impurity sensitive environment of a plasma reaction chamber is an aluminum alloy such as a 5–20 weight % silicon containing aluminum base alloy. For example, the aluminum alloy can include about 15 wt % silicon. However, filler particles of silicon or silicon carbide can also be used.

A plasma screen 52 extends inwardly from a lower edge of the tiles 34. The plasma screen 52 is preferably of an electrically conductive ceramic material such as silicon or silicon carbide and includes openings 54 which are small enough to confine the plasma but allow process gas and processing byproducts to be removed by the vacuum pump.

The heater 48 can comprise an electrical resistance heating element embedded in an aluminum casting. Thus, by passing electrical current through the heating element, heat will be supplied to the aluminum casting which in turn conducts heat into the inner frame 42, the aluminum backing plates 36, the heat conductive elastomer 38 and into the tiles 34. During heating and cooling of the aluminum body of the heater, the heater will expand to a greater extent than the ceramic liner formed by the tiles 34. In order to accommodate such expansion and contraction, the inner and outer support frames are configured to be elastically bendable. For example, the frames can be segmented such that a series of axially extending lower portions thereof are separated by axially extending slits. In addition, the inner and outer frames can be configured to provide a desired amount of thermal conductance. For instance, the outer frame 44 can be of a metal such as aluminum or an aluminum alloy and a lower portion thereof can have a thickness sufficient to withdraw heat from the liner and a thin upper portion to allow adequate bending of the outer frame due to thermal stresses during processing of a semiconductor substrate.

Figure 5:
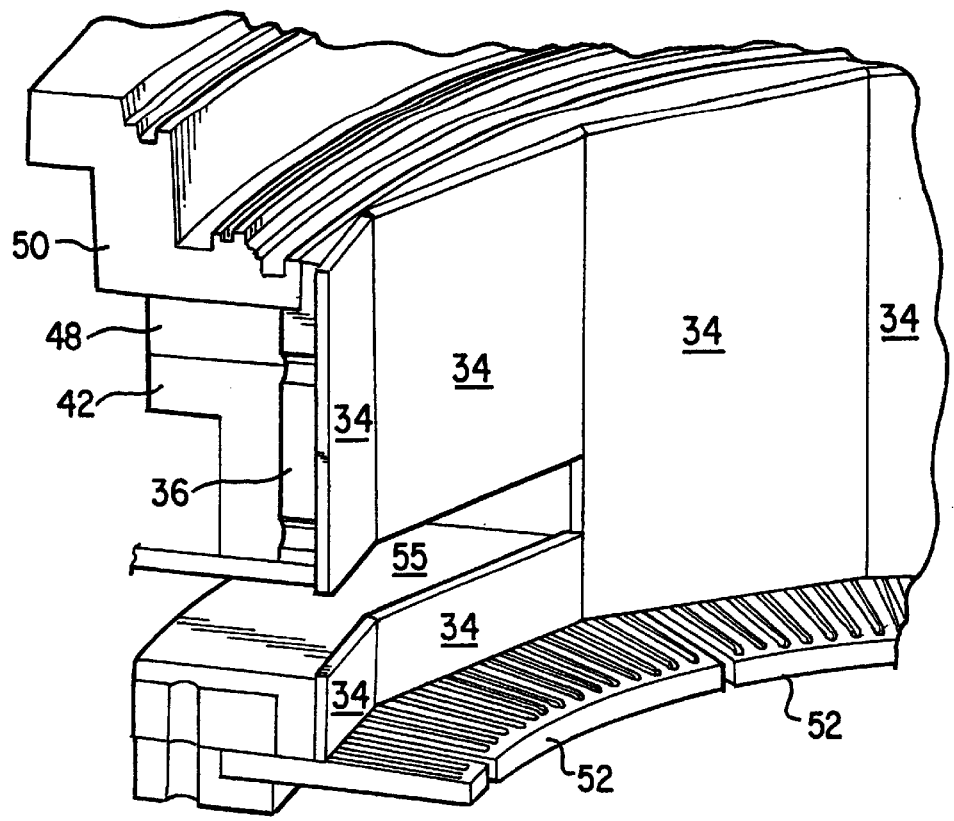
FIG. 5 shows details of a wafer introducing slot in the plasma reaction chamber of FIG. 3.

FIG. 5 shows a portion of the chamber wall wherein a substrate such as a wafer can be introduced and removed from the chamber through a transport slot 55. In the arrangement shown in FIG. 5, some of the tiles 34 are shorter in the axial direction in the vicinity of the slot 55. The slot 55 can be formed from an integral piece of ceramic material or from another material such as anodized aluminum. For instance, the ceramic material having the slot 55 therein can comprise any suitable material such as slip cast SiC coated with CVD SiC, bulk CVD SiC, sintered SiC with or without a CVD SiC coating, reaction bonded SiC, graphite conversion SiC, or the like. FIG. 5 shows details of how the inner support frame can be fitted around the slot 55. The outer support frame (not shown) can be configured in a similar manner.

Figure 6:
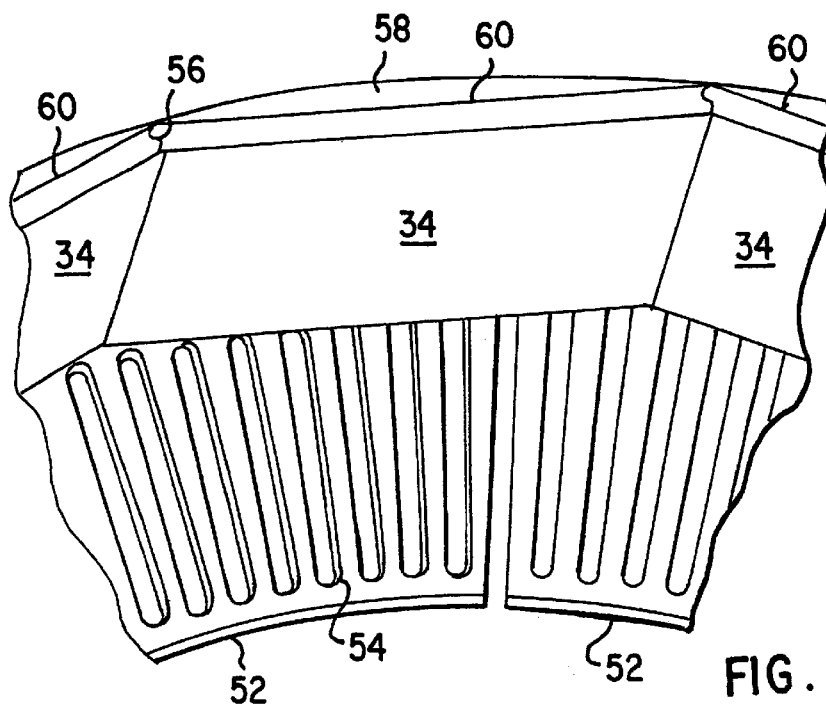
FIG. 6 shows how the edges of the tiles of FIG. 3 fit together in an interlocking arrangement.

In order to prevent a line of sight between the wafer 6 and the chamber wall 46, each tile 34 can have edges 56 which interlock with mating edges of adjacent tiles, as shown in FIG. 6. As shown in this alternative embodiment, the chamber 58 can have polygonal inner surfaces 60 wherein the tiles are bonded directly to flat surfaces 60 of the chamber by an electrically and thermally conductive elastomer. Such an arrangement is advantageous in that it has fewer parts than the tile/backing plate arrangement and allows liner removal for cleaning and replacement to be carried out more quickly.

In the foregoing embodiments, the plasma in the chamber can be confined by the Si or SiC surfaces of the gas distribution plate, the liner, the plasma screen and the substrate support which extends upwardly through the inner periphery of the plasma screen. Because the Si and SiC surfaces are located between the plasma and aluminum surfaces of the chamber, sputtering of the Al surfaces by the plasma is minimized and contaminating processed wafers with Al is reduced compared to chambers having Al surfaces with line-of-sight to the processed wafer.

In the embodiment wherein the liner comprises Si or SiC tiles bonded to an aluminum backing plate by an electrically and/or thermally conductive elastomer bonding material, the tiles can be sized and/or configured to fit together in a manner which covers the entire circumference of an inner wall of the plasma chamber. The chamber wall can be of any desired configuration such as cylindrical, polygonal, etc. A suitable access opening allows passage of individual wafers into and out of the chamber and additional openings can be provided to allow various measurements to be made by conventional accessories such as process monitoring equipment. The tiles can have a flat rectangular surface facing the interior of the chamber. Alternatively, the exposed surface of the tiles can be curved such that the tiles form a cylindrical inner wall of the chamber.

In the embodiment wherein the tile and backing plate assemblies are bolted to an Al inner support frame which extends around the inner wall of the chamber, the thermal stresses generated during start-up, operation and shut-down of the plasma chamber can be accommodated. The number of SiC tiles can be chosen to achieve a desired limit on part and/or bond stresses generated due to thermal forces encountered in the plasma chamber.

In the embodiment wherein a lower flange of the inner support frame is bolted to the lower edge of an Al outer support frame and a flange at the upper edge of the outer support frame is bolted to a top plate located on top of the chamber, the outer support is segmented into vertically extending plates separated by slots which extend from the lower end of the outer support frame to the top flange. In order to provide temperature control of the SiC tiled surface, a heater located above the top flange of the inner support frame can be bolted to the inner frame. With such an arrangement, the heater can generate heat which is thermally conducted from the inner support frame to the backing plate and SiC tile. The heater can comprise a single resistance heater which extends entirely around the inner wall of the chamber. Alternatively, the heater can comprise any suitable heater arrangement which achieves the desired temperature control of the liner, e.g., maintaining the inner surface of the liner at a desired temperature such as in the range of 80 to 160° C. during plasma etching of dielectric materials such as silicon oxide.

The chamber can include a plasma screen surrounding the substrate support. The annular screen can be attached to a carrier ring by any suitable technique. For instance, the screen can be adhesively bonded to the carrier ring by the elastomer bonding material discussed earlier. In addition, the carrier ring can be bolted to a lower flange on the inner frame such that the screen is clamped between the carrier ring and the flange. The screen can be of any suitable material which will withstand a plasma environment for semiconductor production. Silicon carbide is a preferred material for the screen. The screen can comprise a single unitary ring or a plurality of spaced apart ring segments. For instance, the screen can include circumferentially spaced apart segments.

In the embodiments wherein a wafer is transferred into and out of the chamber through a transport slot, the inner and outer frames include cut-outs therein and the tiles surrounding the slot are arranged such that smaller tiles are below the slot and larger tiles are above the slot. The interior of the slot can be formed by a wafer passage insert. A preferred material for the insert is silicon carbide. The insert can comprise a single piece of material or an assembly of several pieces of material. The medium height tiles and short tiles are preferably adhesively bonded with the elastomer to similarly sized backing plates which in turn are bolted to the inner frame.

According to the embodiment of the invention wherein line-of-sight surfaces of aluminum components are avoided by covering the surfaces with the SiC tiles, the edges of the files are preferably designed such that they overlap each other. For instance, the tiles can have mating edges wherein a projection on one tile is received in a recess in an adjacent tile. This effect can be obtained by any edge design wherein a rectilinear path is not provided between the opposed surfaces of the tile. Thus, a mating curved or multi-sided edge surface such as a V-shaped, U-shaped, W-shaped, groove-shaped, notch-shaped, offset-shaped, etc. type edge can provide the desired mating tile edge.

The interlocking tile joints eliminate line-of-sight to aluminum components and accommodate differential thermal expansion/contraction of liner components during startup, operation and/or shutdown of the plasma reactor. For instance, heat from the heater and/or plasma ion thermal energy deposited on the tiles is thermally conducted by the inner frame, through the elastomer bond, up the outer frame and into the chamber top plate. Due to water cooling of the top plate via cooling channels, the heat transferred through outer frame is removed from the chamber.

During processing of semiconductor substrates, the tiles can be preheated by the heater before plasma is generated in the chamber. For instance, the tiles can be heated to a desired temperature by the heater and a thermal control system can be used to adjust the heater power to maintain the tiles at the desired temperature. After plasma is generated in the chamber, the control system can automatically reduce the heater power to maintain the desired time temperature. Further, the thermal impedances of the inner and/or outer frames can be adjusted to achieve the desired range of tile operating temperatures and limit the heater maximum temperature.

Figure 7:
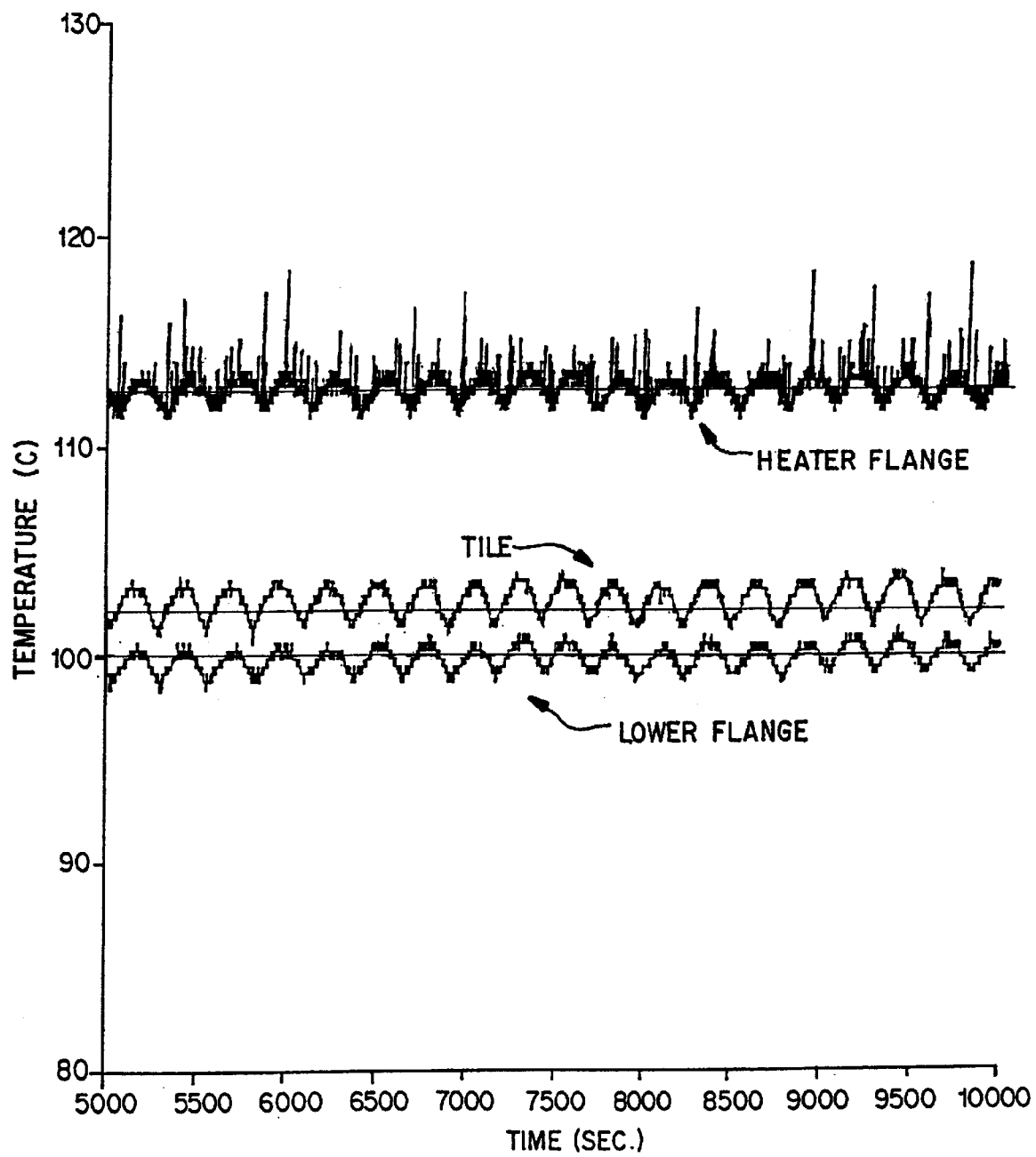
FIG. 7 is a graph showing temperatures of the heater flange, tile and lower flange of the arrangement shown in FIG. 3 over the course of a 200 wafer run.

FIG. 7 shows measured temperatures at the inner support heater flange, the inner support lower flange, and the tile backing plate during plasma etching of a batch of semiconductor wafers. The 2° C. temperature oscillations resulted from variations in plasma ion energy during an etch cycle. The temperature set point for the lower flange was 100° C.

During processing of semiconductor substrates such as plasma etching of silicon wafers, in order to minimize deposition of polymer from gaseous byproducts produced during the etching process, it is desirable to maintain chamber surfaces exposed to the plasma at temperatures of about 80° C. to about 160° C, preferably 110 to 150° C. In addition, such temperature control of these surfaces provides reduction in processing drift during sequential processing of individual wafers. According to a preferred embodiment of the arrangements shown in FIGS. 14–7, prior to striking a plasma in the chamber, a resistance heater heats the ceramic liner by thermal conduction, i.e., heat from the heater passes through a resilient Al frame to the ceramic liner. In such an arrangement, the heater and part of the Al frame in contact therewith may heat to around 300° C. in order to heat the ceramic liner to around 150° C. The resilient Al frame comprised of the inner and outer frames allows the part of the Al frame in contact with the heater to expand relative to the portion of the Al frame in contact with the ceramic liner and thus accommodate any bending stresses on the intermediate part of the Al frame.

In order to provide highly pure and/or highly thermally conductive SiC components, such components can be made of CVD SiC. The CVD SiC can be deposited on a substrate such as graphite and grown to a desired thickness after which the substrate is removed such as by machining. For example, in the case of a cylindrical liner, CVD SiC can be deposited to a desired thickness on a graphite cylinder and the graphite cylinder is later machined away leaving the CVD SiC cylinder liner. Advantages of the CVD SiC include high thermal conductivity (e.g., CVD SiC has about twice as much thermal conductivity as sintered SiC) and tailored electrical resistivity (e.g., resistivity of SiC can be varied from electrically conducting to semiconducting). An advantage of using CVD SiC for the reactor components is that it is possible to obtain a highly uniform temperature distribution across the surface of the component inside the reactor. In the case of processing wherein the component is maintained at a high enough temperature to minimize polymer buildup on the exposed surfaces of the component, the use of CVD SiC is highly advantageous from the standpoint of temperature control and minimizing particle generation.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A plasma processing system useful for processing semiconductor substrates comprising:
   a plasma processing chamber having an interior space bounded by a chamber sidewall;
   a substrate support on which a substrate is processed within the interior space, the chamber sidewall being spaced outwardly of a periphery of the substrate support;
   a gas supply through which process gas can be supplied to the interior space during processing of the substrate;
   an energy source which can energize the process gas in the interior space into a plasma state during processing of the substrate;
   a ceramic liner supported between the chamber sidewall and the periphery of the substrate support, the ceramic liner comprising an assembly of ceramic tiles, the tiles being attached to a support member by an elastomeric joint.

2. The plasma processing system of claim 1, wherein the support member comprises a bendable metal frame.

3. The plasma processing system of claim 1, wherein the ceramic tiles have interlocking edges.

4. The plasma processing system of claim 1, wherein the support member comprises a plurality of metal backing members and the elastomeric joint attaches each of the ceramic tiles to a respective metal backing member.

5. The plasma processing system of claim 4, wherein the metal backing members are supported on a bendable metal frame and the bendable metal frame is supported by a thermally controlled member such that heat can be withdrawn from the ceramic tiles via a thermal path which extends through the elastomeric joint, the metal backing members and the bendable metal frame to the thermally controlled member.

6. The plasma processing system of claim 1, wherein the support member comprises the chamber sidewall and the ceramic tiles are bonded to the chamber sidewall by the elastomeric joint between each of the ceramic tiles and the chamber sidewall.

7. The plasma processing system of claim 1, wherein the support member comprises a bendable metal frame, the bendable metal frame being supported by a thermally controlled member such that heat can be removed from the ceramic liner through a thermal path extending through the bendable metal frame to the thermally controlled member.

8. The plasma processing system of claim 7, further comprising a heater supported by the bendable metal frame such that the heater can heat the ceramic liner.

9. The plasma processing system of claim 7, wherein the bendable metal frame includes a segmented inner frame member and a segmented outer frame member, the elastomeric joint bonds each of the ceramic tiles to a respective segment of the inner frame member, the inner frame member is supported by the outer frame member, and the outer frame member is supported by the chamber.

10. A plasma processing system useful for processing semiconductor substrates comprising:
    a plasma processing chamber having an interior space bounded by a chamber sidewall;
    a substrate support on which a substrate is processed within the interior space, the chamber sidewall being spaced outwardly of a periphery of the substrate support;
    a gas supply through which process gas can be supplied to the interior space during processing of the substrate;
    an energy source which can energize the process gas in the interior space into a plasma state during processing of the substrate; and
    a ceramic liner supported between the chamber sidewall and the periphery of the substrate support, the ceramic liner comprising an assembly of ceramic tiles;
    wherein the ceramic tiles consist essentially of CVD SiC.

11. A plasma processing system useful for processing semiconductor substrates comprising:
    a plasma processing chamber having an interior space bounded by a chamber sidewall;
    a substrate support on which a substrate is processed within the interior space, the chamber sidewall being spaced outwardly of a periphery of the substrate support;
    a gas supply through which process gas can be supplied to the interior space during processing of the substrate;
    an energy source which can energize the process gas in the interior space into a plasma state during processing of the substrate; and
    a ceramic liner supported between the chamber sidewall and the periphery of the substrate support, the ceramic liner comprising an assembly of ceramic tiles;
    wherein the ceramic tiles consist essentially of sintered SiC coated with CVD SiC.

12. The plasma processing system of claim 1, wherein the support member comprises a resilient support member comprising inner and outer metal frame members configured to allow differential thermal stresses on the ceramic liner and the frame members to be accommodated during operation of the plasma processing system.

13. The plasma processing system of claim 12, wherein an upper portion of the outer frame member is supported by a thermally controlled part of the chamber, a lower portion of the outer frame member is attached to a lower portion of the inner frame member, and the ceramic liner is supported by the inner frame member.

14. The plasma processing system of claim 1, wherein the ceramic liner includes a slot therein for passage of the substrate into and out of the chamber.

15. The plasma processing system of claim 14, wherein the tiles are arranged above and below the slot and the slot is in a wafer passage insert attached to the liner, the tiles and insert being of SiC.

16. The plasma processing system of claim 12, wherein the inner and outer metal frame members are cylindrical and include continuous upper portions and segmented lower portions, the segmented lower portions comprising axially extending segments separated from each other by axially extending slots.

17. The plasma processing system of claim 1, further comprising a ceramic plasma screen extending inwardly from a lower portion of the ceramic liner, the ceramic plasma screen including passages through which process gas and reaction byproducts are removed from the interior of the chamber during processing of a substrate.

18. The plasma processing system of claim 17, wherein the ceramic plasma screen is of SiC and comprises a plurality of segments supported in an annular space between the chamber sidewall and the substrate support, the passages comprising slots extending radially inwardly from the chamber sidewall.

19. A plasma processing system useful for processing semiconductor substrates comprising:

a plasma processing chamber having an interior space bounded by a chamber sidewall;

a substrate support on which a substrate is processed within the interior space, the chamber sidewall being spaced outwardly of a periphery of the substrate support;

a gas supply through which process gas can be supplied to the interior space during processing of the substrate;

an energy source which can energize the process gas in the interior space into a plasma state during processing of the substrate;

a ceramic liner supported between the chamber sidewall and the periphery of the substrate support, the ceramic liner comprising an assembly of ceramic tiles; and a ceramic plasma screen extending inwardly from a lower portion of the ceramic liner, the ceramic plasma screen including passages through which process gas and reaction byproducts are removed from the interior of the chamber during processing of a substrate;

wherein the ceramic plasma screen is attached to a resilient support member by an electrically conductive elastomeric joint, the resilient support member comprising a bendable metal frame and the plasma screen being electrically grounded to the bendable metal frame by the elastomeric joint.

20. A method of processing a substrate with the apparatus of claim 1, wherein an individual substrate supported on the substrate support is etched with plasma produced in the chamber.

* * * * *